(12) United States Patent
Hooper et al.

(10) Patent No.: US 7,375,367 B2
(45) Date of Patent: May 20, 2008

(54) SEMICONDUCTOR LIGHT-EMITTING DEVICE HAVING AN ACTIVE REGION WITH ALUMINUM-CONTAINING LAYERS FORMING THE LOWERMOST AND UPPERMOST LAYER

(75) Inventors: Stewart Hooper, Oxfordshire (GB); Valerie Bousquet, Oxford (GB); Katherine L. Johnson, Oxford (GB); Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 95 days.

(21) Appl. No.: 10/974,348

(22) Filed: Oct. 27, 2004

(65) Prior Publication Data

US 2005/0116215 A1 Jun. 2, 2005

(30) Foreign Application Priority Data

Oct. 28, 2003 (GB) .................................. 0325100.6

(51) Int. Cl.
*H01L 29/06* (2006.01)

(52) U.S. Cl. ......................... 257/13; 257/22; 257/189

(58) Field of Classification Search .................. 257/12, 257/13, 17, 40, 79, 85, 22, 189
See application file for complete search history.

(56) References Cited

U.S. PATENT DOCUMENTS

| | | | | |
|---|---|---|---|---|
| 5,834,331 | A * | 11/1998 | Razeghi | 438/40 |
| 6,015,979 | A * | 1/2000 | Sugiura et al. | 257/86 |
| 6,147,364 | A * | 11/2000 | Itaya et al. | 257/76 |
| 6,388,275 | B1 * | 5/2002 | Kano | 257/94 |
| 6,906,352 | B2 * | 6/2005 | Edmond et al. | 257/94 |
| 6,977,952 | B2 * | 12/2005 | Yamaguchi et al. | 372/45.01 |
| 2001/0030316 | A1 * | 10/2001 | Kuramoto et al. | 257/12 |
| 2003/0006148 | A1 * | 1/2003 | Nielsen et al. | 205/775.5 |
| 2003/0059971 | A1 * | 3/2003 | Chua et al. | 438/46 |
| 2003/0085409 | A1 * | 5/2003 | Shen et al. | 257/79 |
| 2003/0189218 | A1 * | 10/2003 | Watanabe et al. | 257/103 |
| 2004/0012014 | A1 * | 1/2004 | Yamanaka et al. | 257/13 |

FOREIGN PATENT DOCUMENTS

| | | |
|---|---|---|
| JP | 11-074622 | 3/1999 |
| JP | 2000-196194 | 7/2000 |
| JP | 2000-332290 | 11/2000 |
| TW | 0412874 | 11/2000 |

OTHER PUBLICATIONS

Taiwanese Office Action for corresponding Application No. 93132466 dated Dec. 7, 2005.

(Continued)

*Primary Examiner*—Wai-Sing Louie
*Assistant Examiner*—Mursalin B. Hafiz
(74) *Attorney, Agent, or Firm*—Renner, Otto, Boisselle & Sklar, LLP (57) ABSTRACT

A semiconductor light-emitting device fabricated in a nitride material system has an active region disposed over a substrate. The active region comprises a first aluminium-containing layer forming the lowermost layer of the active region, a second aluminium-containing layer forming the uppermost layer of the active region, and at least one InGaN quantum well layer disposed between the first aluminium-containing layer and the second aluminum-containing layer. The aluminium-containing layers provide improved carrier confinement in the active region, and so increase the output optical power of the device.

16 Claims, 5 Drawing Sheets

15

| | |
|---|---|
| Mg:doped GaN(300nm thick) | 9 |
| Mg doped AlGaN(0.5μm thick) | 8 |
| Mg doped GaN(100nm thick) | 7 |
| AlGaN(5nm thick) | 14 |
| Quantum wells | 13 |
| AlGaN(20nm thick) | 12 |
| Si doped GaN (100nm thick) | 4 |
| Si doped AlGaN(0.5μm thick) | 3 |
| Si doped GaN (4μm thick) | 2 |
| Sapphire (0001) substrate | 1 |

| | |
|---|---|
| 14 | AlGaN layer |
| 17 | Barrier layer |
| 16 | QW layer |
| 12 | AlGaN layer |

(b)

OTHER PUBLICATIONS

Korean Office Action for corresponding Application No. 519980961371 dated Apr. 27, 2006.

Chinese Office Action for corresponding Application No. 200410102340.1 dated Dec. 22, 2006.

Chinese Office Action for corresponding Application No. 200410102340.1 dated Jun. 22, 2007.

* cited by examiner

| 14 | AlGaN layer |
|---|---|
| 17 | Barrier layer |
| 16 | QW layer |
| 15 | Barrier layer |
| 12 | AlGaN layer |

FIG 5(a)

| 14 | AlGaN layer |
|---|---|
| 17 | Barrier layer |
| 16 | QW layer |
| 12 | AlGaN layer |

FIG 5(b)

| 14 | AlGaN layer |
|---|---|
| 16 | QW layer |
| 15 | Barrier layer |
| 12 | AlGaN layer |

FIG 5(c)

| 14 | AlGaN layer |
|---|---|
| 17 | Barrier layer |
| 16 | QW layer |
| 15 | Barrier layer |
| 16' | QW layer |
| 15' | Barrier layer |
| 12 | AlGaN layer |

FIG 5(d)

SEMICONDUCTOR LIGHT-EMITTING DEVICE HAVING AN ACTIVE REGION WITH ALUMINUM-CONTAINING LAYERS FORMING THE LOWERMOST AND UPPERMOST LAYER

FIELD OF THE INVENTION

The present invention relates to a semiconductor light-emitting device, and in particular to a semiconductor light-emitting device fabricated in a nitride materials system such as, for example, the (Al,Ga,In)N materials system. The invention may be applied to, for example, a light emitting diode (LED) or to a laser diode (LD).

BACKGROUND OF THE INVENTION

The (Al,Ga,In)N material system includes materials having the general formula $Al_xGa_yIn_{1-x-y}N$ where $0 \leq x \leq 1$ and $0 \leq y \leq 1$. In this application, a member of the (Al,Ga,In)N material system that has non-zero mole fractions of aluminium, gallium and indium will be referred to as AlGaIN, a member that has a zero aluminium mole fraction but that has non-zero mole fractions of gallium and indium will be referred to as InGaN, a member that has a zero indium mole fraction but that has non-zero mole fractions of gallium and aluminium will be referred to as AlGaN, and so on. There is currently considerable interest in fabricating semiconductor light-emitting devices in the (Al,Ga,In)N material system since devices fabricated in this system can emit light in the blue wavelength range of the spectrum. Semiconductor light-emitting devices fabricated in the (Al,Ga,In)N material system are described in, for example, U.S. Pat. No. 5,777,350.

Figure 1:
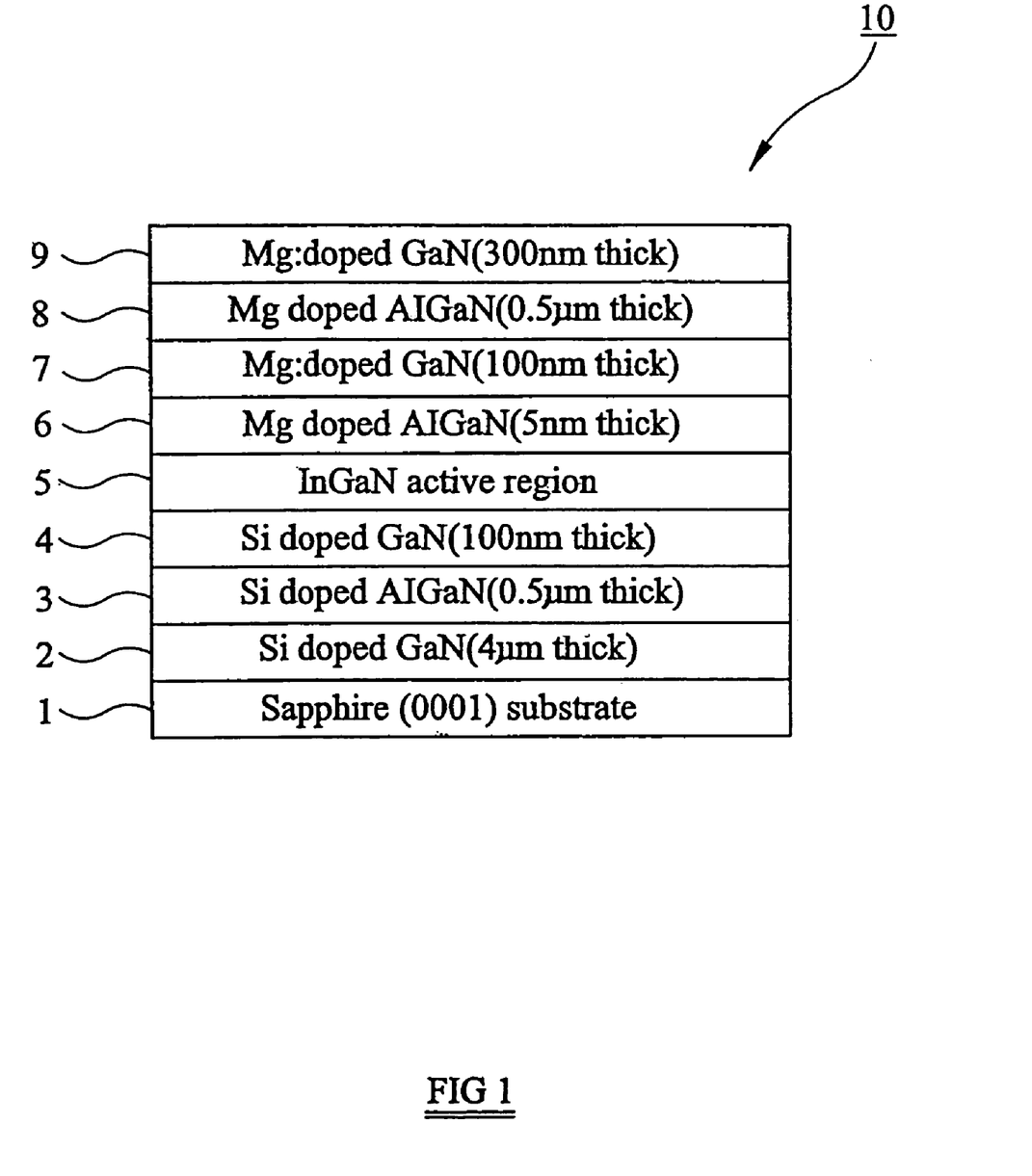
FIG. 1 is a schematic sectional view of a semiconductor laser device fabricated in the (Al,Ga,In)N system.

FIG. 1 is a schematic view of a typical semiconductor laser device (or laser diode—"LD") 10 fabricated in the (Al,Ga,In)N material system. The device is able to emit light in the blue wavelength range.

The laser device 10 of FIG. 1 is grown over a substrate 1. In the laser diode 10 of FIG. 1 the substrate 1 is a sapphire substrate. A buffer layer 2, a first cladding layer 3 and a first optical guiding layer 4 are grown, in this order, over the substrate 1. In the embodiment of FIG. 1 the buffer layer 2 is a n-type GaN layer, the first cladding layer 3 is an n-type AlGaN layer, and the first optical guiding layer 4 is an n-type GaN layer.

An active region 5 is grown over the first optical guiding layer 4.

A second optical guiding layer 7, a second cladding layer 8 and a cap layer 9 are grown, in this order, over the active region 5. The second optical guiding layer 7 and second cladding layer 8 are of opposite conductivity type to the first optical guiding layer 4 and first cladding layer 3; in the laser device 10 of FIG. 1 the first optical guiding layer 4 and first cladding layer 3 are n-type so the second optical guiding layer 7 and second cladding layer 8 are p-type layers. In the laser device of FIG. 1 the second optical guiding layer 7 is a p-type GaN layer, the second cladding layer 8 is a p-type AlGaN layer, and the cap layer 9 is a p-type GaN layer.

The structure of the active region 5 of the laser device 10 is not shown in detail in FIG. 1. In general, however, the active region 5 will be either a single quad well (SQW) active region having one quantum well layer disposed between first and second barrier layers, or a multiple quantum well (MQW) active region having two or more quantum well layers with each quantum well layer being disposed between two barrier layers. The quantum well layer(s) may be, for example, layers of InGaN, AlGaN or AlGaInN.

ACKNOWLEDGEMENT OF THE PRIOR ART

It is known to dispose a thin, doped AlGaN layer 6 directly on the active region 5. The AlGaN layer 6 is doped to have the same conductivity type as the second optical guiding layer 7 and the second cladding region 8, and so is p-type doped in the device of FIG. 1. The AlGaN layer 6 acts as an electron-blocking layer, and prevents electron overflow from the active region 5. The AlGaN layer 6 also protects the active region during the growth process, from the high growth temperatures used in the deposition of the second optical guiding layer 7, the second cladding layer 8, and the cap layer 9. The provision of such a thin p-doped AlGaN layer is disclosed by, for example, M. Hansen et al., in "Applied Physics Letters", Vol. 81, No. 22, pp4275-4277 (2002).

WO 02/03517 discloses a light-emitting device in which the light-emitting layer comprises first and second AlGaN layers and one or more quantum well layers provided between the first AlGaN layer and the second AlGaN layer. If two or more quantum well layers are provided, an AlGaN barrier layer is provided between each two quantum well InGaN layers.

US 2001/0030317 is directed to providing a multiple quantum barrier either above or below a multiple quantum well active region, to improve carrier confinement and to minimise strain in the device. This document does not relate specifically to the structure of the active region, but the disclosed active region contains at least two quantum well layers with an AlGaN barrier layer provided between each two neighbouring quantum well layers.

JP-A-11 74 622 relates to a nitride semiconductor laser having an active region in which InGaN quantum well layers and InGaN barrier layers are alternately laminated. The active region does not contain any layers that intentionally include aluminium The active region is sandwiched between GaN optical guiding layers, which in turn are sandwiched between AlGaN cladding layers.

SUMMARY OF THE INVENTION

The present invention provides a semiconductor light-emitting device fabricated in a nitride material system and having an active region disposed over a substrate, the active region comprising: a first aluminium-containing layer forming the lowermost layer of the active region; a second aluminium-containing layer forming the uppermost layer of the active region; at least one InGaN quantum well layer disposed between the first aluminium-containing layer and the second aluminium-containing layer, and at least one aluminium-free barrier layer disposed between the first aluminium-containing layer and the second aluminium-containing layer.

As used herein, the term "aluminium-free" layer denotes a layer that does not intentionally contain aluminium.

Providing the AlGaN or AlGaInN layers within the active layer, as the lowermost and uppermost layers of the active region, has been found significantly to increase the optical power output of the device.

The terms "lowermost" and "uppermost" as used herein denote the layers of the active region that are respectively closest to, and furthest from, the substrate of the device.

The first aluminium-containing layer may be a layer of AlGaN or AlGaInN, and the second aluminium-containing layer may be a layer of AlGaN or AlGaInN.

The active region may comprise a first aluminium-free barrier layer disposed between the first aluminium-containing layer and the at least one InGaN quantum well layer. It may comprise a second aluminium-free barrier layer disposed between the at least one InGaN quantum well layer and the second aluminium-containing layer.

The active region may comprise at least two InGaN quantum well layers, and each two neighbouring InGaN quantum well layers may be separated by an aluminium-free barrier layer. Alternatively, the active region may contain only one quantum well layer.

The or each barrier layer may be an InGaN layer.

The first aluminium-containing layer may be a layer of $Al_xGa_{1-x}N$ where $0<x\leq0.4$. It may have a thickness of no more than 50 nm, and may have a thickness of approximately 20 nm.

The second aluminium containing layer may be a layer of $Al_yGa_{1-y}N$ where $0<y\leq0.4$. It may have a thickness of no more than 15 nm, and it may have a thickness of approximately 5 nm.

The first aluminium-containing layer may be not intentionally doped. The second aluminium-containing layer may be not intentionally doped. Alternatively, either or both of the aluminium-containing layers may be intentionally doped.

The or each InGaN quantum well layer may be an $In_zGa_{1-z}N$ layer where $0<z\leq0.3$. This provides a device with an emission wavelength in the 380-450 nm wavelength range. In particular, the invention may be applied to a device having an emission wavelength in the range from 390 nm to 410 nm. The emission wavelength range of from 390 nm to 410 nm is commercially important, since lasers for the Blu-Ray Digital Video Disc (DVD) standard will have an emission wavelength in this range.

BRIEF DESCRIPTION OF THE DRAWINGS

Preferred features of the present invention will now be described by way of illustrative example with reference to the accompanying figure in which.

Like references denote like components throughout the drawings.

DETAILED DESCRIPTION OF THE PREFERRED EMBODIMENTS

According to the present invention, the lowermost and uppermost layers of the active region of a light-emitting device fabricated in a nitride material system such as, for example, the (Al,Ga,In)N materials system are thin aluminium-containing lays such as, for example, layers of AlGaN or AlGaInN. In preferred embodiments of the invention no other layers of the active region intentionally include aluminium.

The layers of the active region disposed between the outer aluminium-containing layers include one or more quantum well (QW) layers and one or more aluminium-free barrier layer. In the case of an active region having a single quantum well layer, a barrier layer may be provided between the lower aluminium-containing layer and the quantum well layer and/or between the upper aluminium-containing layer and the quantum well layer. That is, an SQW active region of the invention may have any of the following structures:

(A1) Aluminium-containing Layer
Barrier layer
QW layer
Barrier layer
Aluminium-containing Layer or (B1) Aluminium-containing Layer
Barrier layer
QW layer
Aluminium-containing Layer or (C1) Aluminium-containing Layer
QW layer
Barrier layer
Aluminium-containing Layer In case (A1) neither aluminium-containing layer is acting as a barrier layer. In case (B1) only the lower aluminium-containing layer acts as a barrier layer, and in case (C1) only the upper aluminium-containing layer acts as a barrier layer.

In the case of an active region having two or more quantum well layers, a barrier layer is provided between each two neighbouring quantum well layers. The outer aluminium-containing layers may again act as barrier layers, or a barrier layer may be provided between the lower aluminium-containing layer and the lowest quantum well layer and/or between the upper aluminium-containing layer and the upper quantum well layer. That is, an MQW active region of the invention having two quantum well layers may have any of the following structures:

(A2) Aluminium-containing Layer
Barrier layer
QW layer
Barrier layer
QW layer
Barrier layer
Aluminium-containing layer or (B2) Aluminium-containing Layer
QW layer
Barrier layer
QW layer
Aluminium-containing layer or (C2) Aluminium-containing Layer
Barrier layer
QW layer
Barrier layer
QW layer
Aluminium-containing layer or (D2) Aluminium-containing Layer
QW layer Barrier layer
QW layer
Barrier layer
Aluminium-containing layer Analogous structures exist for an MQW active region having three or more quantum well layers.

Figure 2:
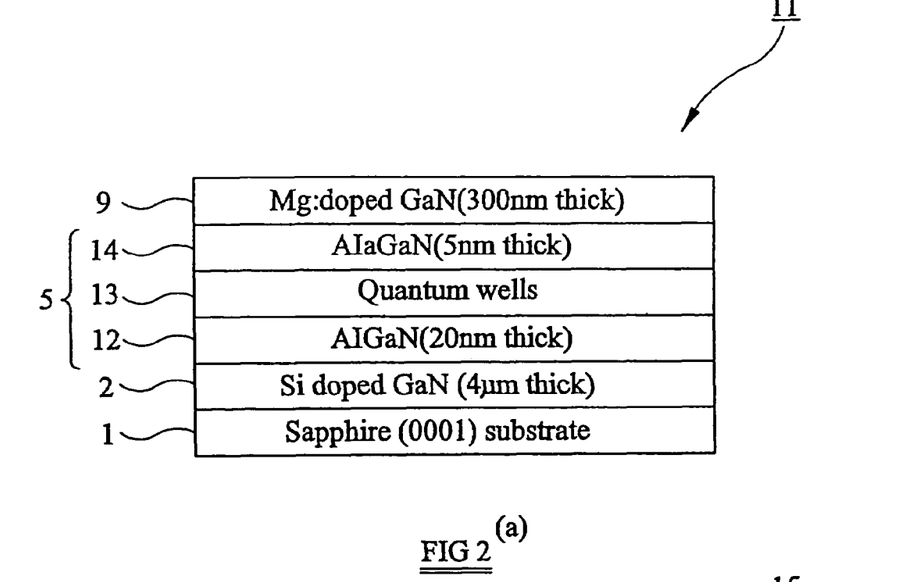
FIG. 2(a) is a schematic view of an LED according to the present invention.
FIG. 2(b) is a schematic view of a laser diode according to the present invention.

FIG. 2(a) is a schematic sectional view of a light-emitting diode according to the present invention and fabricated in the (Al,Ga,In)N system The LED 11 of FIG. 2(a) comprises a substrate 1 over which is disposed a buffer layer 2. In the LED 11 of FIG. 2 the substrate 1 is a sapphire substrate, and the buffer layer 2 is a 4 μm thick n-type GaN layer grown over a (0001) face of the substrate.

An active region 5 for light generation is disposed over the buffer layer 2. A cap layer 9 is disposed over the active region 5, and in this example the cap layer 9 is a 300 nm thick p-type GaN layer.

The active region 5 comprises a plurality of layers. The lowermost layer 12 and the uppermost layer 14 of the active region 5 are aluminium-containing layers, in this example, layers of AlGaN. None of the other layers of the active region 5 intentionally contains aluminium.

The active region 5 further comprises one or more quantum well layers provided between the lowermost AlGaN layer 12 and the uppermost AlGaN layer 14 of the active region 5. The quantum well layer(s) are denoted schematically as 13 in FIG. 2(a). As explained above, if the active region contains a single quantum well layer, the active region may have a structure as shown at any of (A1) to (C1) above. That is, the lowermost AlGaN layer 12 and the uppermost AlGaN layer 14 may act as barrier layers for the quantum well layer, or a separate barrier layer may be provided between the lower AlGN layer and the quantum well layer and/or between the upper AlGaN layer and the quantum well layer.

If the active region contains two or more quantum well layers, a barrier layer is provided in the active region between each two neighbouring quantum well layers. The upper AlGaN layer 14 may act as the upper barrier layer for the uppermost quantum well layer, and the lower AlGaN layer 12 may act as the lower barrier layer for the lowest quantum well layer. Alternatively, a separate barrier layer may be provided between the lower AlGaN layer 12 and the lowest quantum well layer and/or between the upper AlGaInN layer and the uppermost quantum well layer. If the active region contains exactly two quantum well layers it may have any of the structures shown at (A2) to (D2) above; if the active region contains more than two quantum well layers it may have a structure analogous to any of the structures shown at (A2) to (D2) above.

In the LED of FIG. 2(a), the upper AlGaN layer 14 is preferably a layer of $Al_yGa_{1-y}N$ where $0<y\leq0.4$. The thickness of the upper AlGaN layer 14 is preferably in the range of from 1 nm to 15 nm, since an upper AlGaN layer 14 with a thickness in this range provides an increased optical power output as will be shown in FIG. 3(b). The thickness of the upper AlGaN layer 14 is particularly preferably approximately 5 nm, as shown in FIG. 2(a), since this provides the maximum optical output power.

In the LED of FIG. 2(a), the lower AlGaN layer 12 is preferably a layer of $Al_xGa_{1-x}N$ where $0<x\leq0.4$. The thickness of the lower AlGaN layer 12 is preferably in the range of from 1 nm to 50 nm, since a lower AlGaN layer 12 with a thickness in this range provides an increased optical power output as will be shown in FIG. 3(a). The thickness of the lower AlGaN layer 12 is particularly preferably approximately 20 nm thick as shown in FIG. 2(a), since this provides the maximum optical output power.

One or both of the lower and upper AlGaN layers 12, 14 in FIG. 2(a) may be intentionally doped, or both layers 12, 14 may not be intentionally doped If the layers are doped, the lower layer is preferably doped to have the same conductivity type as the buffer layer 2 (n-type in this example) and the upper layer is preferably doped to have the same conductivity type as the cap layer 9 (type in this example).

In the LED of FIG. 2(a), the quantum well layer, or each quantum well layer, of the active region 5 is preferably an InGaN layer, and is particularly preferably an $In_zGa_{1-z}N$ layer where $0<z\leq0.3$. In a device in which the active region has two or more quantum well layers, the intermediate barrier layer(s) are preferably layers of InGaN (with an In mole fraction different from the In mole fraction of the quantum well layers) or GaN. (An "intermediate" barrier layer denotes a barrier layer disposed between two neighbouring quantum well layers of the active region or a barrier layer disposed between an aluminium-containing layer and a quantum well layer.)

FIG. 2(b) illustrates a semiconductor laser device according to the present invention. The laser device 15 of FIG. 2(b) is fabricated in the (Al,Ga,In)N system.

The laser device 15 is grown over a substrate 1. In FIG. 1 the substrate 1 is a sapphire substrate. A buffer layer 2, a first cladding layer 3 and an first optical guiding layer 4 are grown, in this order, on a (0001) face of the substrate 1. In the embodiment of FIG. 2(b) the buffer layer 2 is a 4 μm thick n-type GaN layer, the first cladding layer 3 is a 0.5 μm thick n-type AlGaN layer, and the first optical guiding layer 4 is a 100 nm thick n-type GaN layer.

An active region 5 is grown over the first optical guiding layer 4.

A second optical guiding layer 7, a second cladding layer 8 and a cap layer 9 are grown, in this order, over the active region 5. The second optical guiding layer 7 and second cladding layer 8 have opposite conductivity type to the first optical guiding layer 4 and first cladding layer 3. In the laser diode 15 of FIG. 2(b) the second optical guiding layer 7 is a 100 nm thick p-type GaN layer, the second cladding layer 8 is a 0.5 μm thick p-type AlGaN layer, and the cap layer 9 is a 300 nm thick p-type GaN layer.

The active region 5 of the laser device 15 comprises a plurality of layers. The lowermost layer 12 and the uppermost layer 14 of the active region 5 are aluminium-containing layers, in this example, layers of AlGaN. None of the other layers of the active region 5 intentionally contains aluminium.

The active region 5 further comprises one or more quantum well layers provided between the lowermost AlGaN layer 12 and the uppermost AlGaN layer 14 of the active region 5. The quantum well layer(s) are denoted schematically as 13 in FIG. 2(a).

The active region 5 of the laser device of FIG. 2(b) may have any of the structures described above for the LED of FIG. 2(a). The compositions, thicknesses and doping of the layers of the active region 5 of the laser of FIG. 2(b) are preferably as described above for the LED of FIG. 2(a).

A laser device having the general structure shown in FIG. 2(b), or an LED having the general structure shown in FIG. 2(a), is able to emit light in the violet-blue wavelength range from 380 nm to 450 nm, and in particular may have an emission wavelength in the range from 390 nm to 410 nm.

FIGS. 5(a) to 5(d) are schematic illustrations of some possible active regions for a device of the present invention.

Figure 5A:
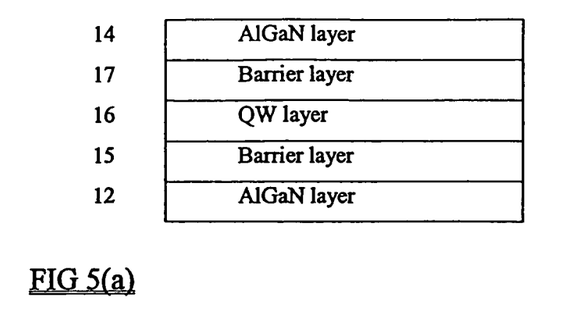
FIGS. 5(a) to 5(d) show examples of possible active regions for a device of the present invention.

The active region 5 shown in FIG. 5(a) has a first AlGaN layer 12 as its lowermost layer, and has a second AlGaN layer 14 as its uppermost layer. A single quantum well layer 16, for example an InGaN layer, is disposed between the first AlGaN layer 12 and the second AlGaN layer 14. A first barrier layer 15 is disposed between the first AlGaN layer 12 and the quantum well layer 16, and a second barrier layer 17 is disposed between the second AlGaN layer 14 and the quantum well layer 16. The barrier layers may be, for example, layers of InGaN or GaN. The active region of FIG. 5(a) thus corresponds to the structure "A1" described above.

The active region of FIG. 5(a) may be applied to the LED structure shown in FIG. 2(a) or to the laser diode structure shown in FIG. 2(b). The first barrier layer 15, the quantum well layer 16 and the second barrier layer 17 together constitute the layer denoted schematically as "13" in FIG. 2(a) or FIG. 2(b).

Figure 5B:
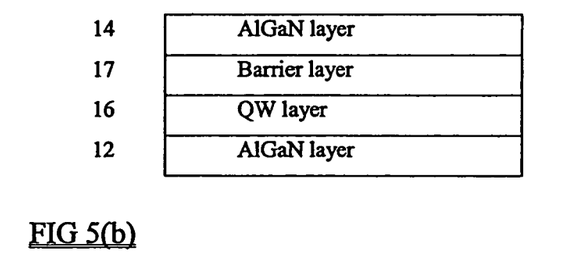

The active region shown in FIG. 5(b) corresponds generally to the active region shown in FIG. 5(a), except that the first barrier layer 15 of FIG. 5(a) is not present in the active region of FIG. 5(b). In the active region of FIG. 5(b) the quantum well layer 16 is directly adjacent to the lower AlGaN layer 12. The active region of FIG. 5(b) corresponds to the structure "B1" described above.

Figure 5C:
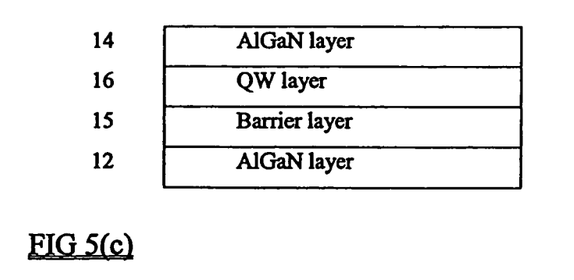

The active region shown in FIG. 5(c) corresponds generally to the active region shown in FIG. 5(a), except that the second barrier layer 17 of FIG. 5(a) is not present in the active region of FIG. 5(c). In the active region of FIG. 5(c) the quantum well layer 16 is directly adjacent to the upper AlGaN layer 14. The active region of FIG. 5(b) corresponds to the structure "C1" described above.

Figure 5D:
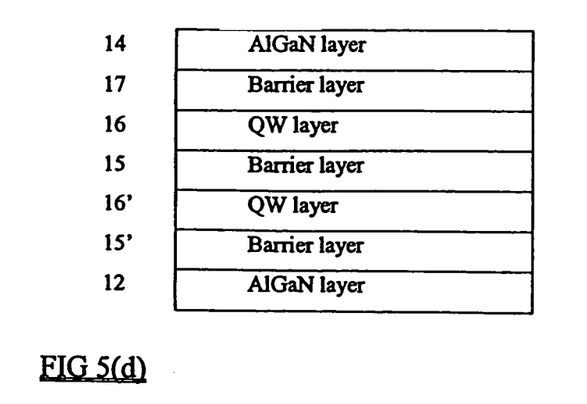

FIG. 5(d) shows an example of an active region that contains more than one quantum well layer. The active region 5 shown in FIG. 5(d) has a first AlGaN layer 12 as its lowermost layer, and has a second AlGaN layer 14 as its uppermost layer. Two quantum well layers 16, 16' are disposed between the first AlGaN layer 12 and the second AlGaN layer 14. A first barrier layer 15 is disposed between the first AlGaN layer 12 and the first quantum well layer 16, and a second barrier layer 17 is disposed between the second AlGaN layer 14 and the second quantum well layer 16'. A further barrier layer 15' is disposed between the first quantum well layer 16 and the second quantum well layer 16'. The active region of FIG. 5(a) thus corresponds to the structure "A2" described above.

The active regions of FIGS. 5(b) to 5(d) may be applied to the LED structure shown in FIG. 2(a) or to the laser diode structure shown in FIG. 2(b). The barrier layer(s) 15, 15', 17 and the quantum well layer(s) 16, 16' together constitute the layer denoted schematically as "13" in FIG. 2(a) or FIG. 2(b). The or each quantum well layer 16, 16' may be, for example an InGaN layer and the or each barrier layer 15, 15',17 may be, for example, a layer of InGaN or GaN.

Figure 3:
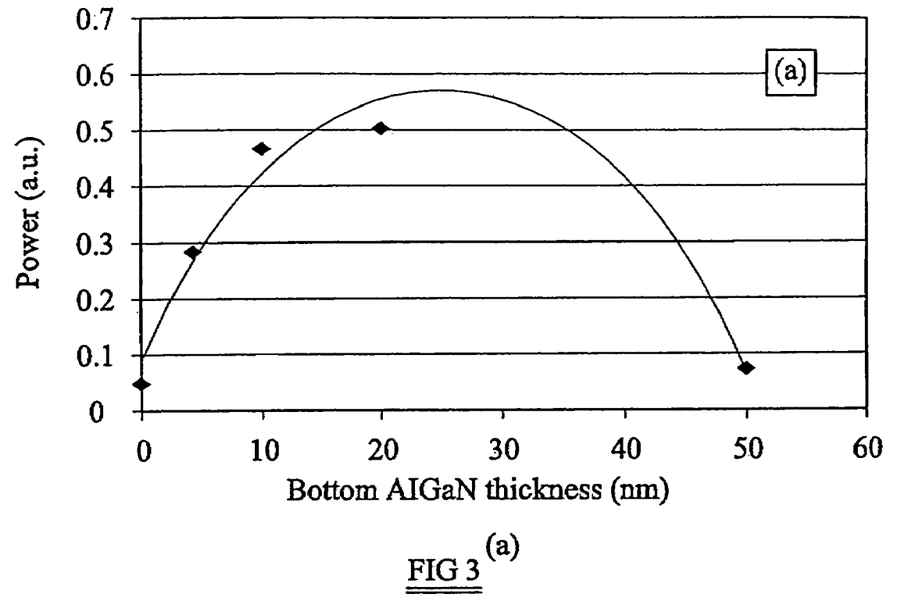
FIGS. 3(a) and 3(b) illustrate the increased optical power output of a light-emitting device according to the present invention.

FIG. 3(a) illustrates the output optical power, in arbitrary units, obtained for an LED of the present invention and having an active region in which the lowermost and uppermost layers of the active region are AlGaN layers. FIG. 3(a) shows the output optical power for varying thicknesses of the lower AlGaN layer 12 of the active region, including a data point for a structure in which the lower AlGaN layer was not present (this is the data point at zero thickness). These results were obtained using an active region in which the upper AlGaN layer 14 has a thickness of 2.5 nm.

It will be seen that an increased optical output power, compared to the optical output power of a device in which the lowermost layer of the active region is not an aluminium-containing layer, is obtained if the lower AlGaN layer has a thickness in the range of from approximately 1 nm to approximately 50 nm. The maximum output optical power is obtained for an active region in which the lower AlGaN layer 12 has a thickness of approximately 20-25 nm. Providing the lower AlGaN layer 12 can increase the output optical power of the device by over a factor of 10.

FIG. 3(b) illustrates the output optical power, in arbitrary units, obtained for an LED of the present invention and having an active region in which the lowermost and uppermost layers of the active region are AlGaN layers. FIG. 3(b) shows the output optical power for varying thicknesses of the upper AlGaN layer 14 of the active region. These results were obtained with an LED in which the lower AlGaN layer 12 of the active region has a thickness of 20 nm. The vertical scale in FIG. 3(b) is the same as the vertical scale in FIG. 3(a).

It will be seen that an increased optical output power, compared to the optical output power of a device in which the uppermost layer of the active region is not an aluminium-containing layer, is obtained if the upper AlGaN layer has a thickness in the range of from approximately 1 nm to approximately 15 nm. The maximum output optical power is obtained for an active region in which the upper AlGaN layer 14 has a thickness of approximately 5-8 nm. Providing the upper AlGaN layer 14 can again substantially increase the output optical power of the device. Although there is no data point in FIG. 3(b) at zero thickness of the upper AlGaN layer, the output power of an LED in which the active region did not have the upper AlGaN layer 14 would be expected to be less than 0.1 au.

In a light-emitting device of the invention, the upper and lower AlGaN layers 14, 12 form part of the active region 5 of the device. A layer forms part of the active region of a light-emitting device if the layer influences the intensity and/or wavelength of the light emitted by the device for specified operating conditions (such as specified drive current and temperature). That the upper and lower AlGaN layers 12, 14 do form part of the active region can be seen from FIG. 4.

Figure 4:
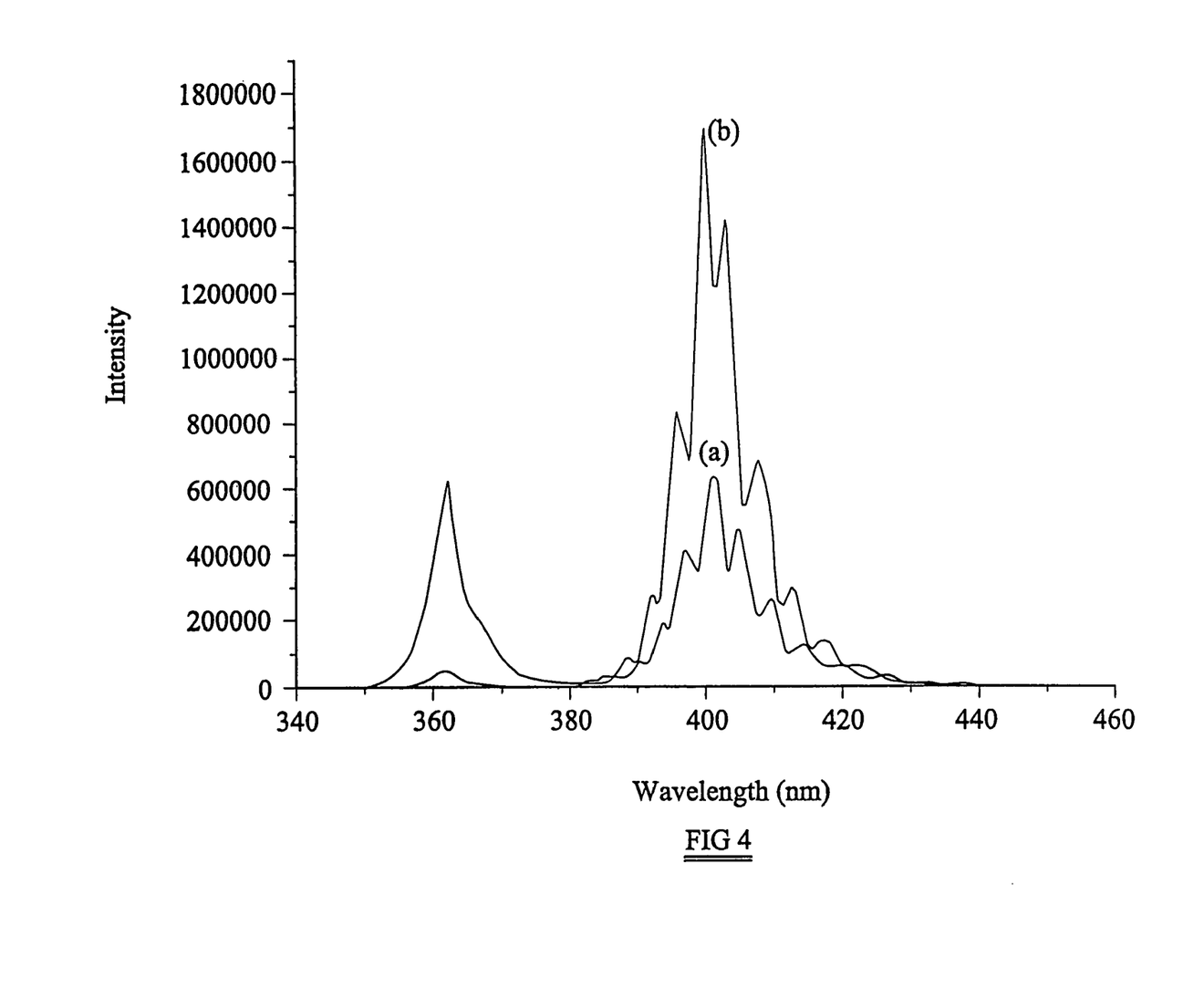
FIG. 4 shows photoluminescence spectra for a conventional semiconductor laser device fabricated in the (Al,Ga,In)N system and for a laser device of the present invention.

FIG. 4 shows the photoluminescence spectrum, in arbitrary units, for two active regions. The active regions were not incorporated in complete devices but were deposited on a GaN substrate to enable photoluminescence measurements to be performed.

One active region is an active region of the present invention, with the uppermost and lowermost layers of the active region being aluminium-containing layers, in this case AlGaN layers. The other active region is a conventional active region with the uppermost and lowermost layers of the active region being GaN layers. Apart from the differences between the uppermost and lowermost layers of the active region, the two active regions are identical.

In FIG. 4, trace (a) is the photoluminescence spectrum for the conventional active region having GaN layers as the uppermost and lowermost layers, and trace (b) is the photoluminescence spectrum for the active region of the invention having AlGaN layers as the uppermost and lowermost layers. It will been seen that in trace (b) the peak in the photoluminescence intensity at a wavelength of around 400 nm (this peak corresponds to the intended emission wavelength of the active region) has a maximum that is approximately three time greater than the maximum photoluminescence intensity of the peak in trace (a) at this wavelength. The increased PL efficiency of the active region having the AlGaN layers as the outermost layers confirms that the AlGaN layers are constituents of the active region. The AlGaN layers provide more effective confinement of carriers in the active region. In contrast, the AlGaN electron blocking layer 6 in the conventional laser device 10 of FIG. 1 does not form part of the active region 5 of the laser device 10.

The peak at approximately 360 nm in Figure represents photoluminescence from the underlying GaN substrate. It will be seen that this photoluminescence peak has a significantly higher intensity for the conventional active region than it does for the active region of the invention. This is because many carriers escape from the conventional active region into the underlying substrate, leading to a high photoluminescence intensity of the substrate. In contrast, the active region of the invention provides better carrier confinement so that fewer carriers can escape into the underlying substrate and the photoluminescence intensity of the underlying substrate is correspondingly reduced.

A light-emitting device of the present invention may be manufactured using any suitable semiconductor growth technique such as, for example, MBE (molecular beam epitaxy) or MOVPB (metal-organic vapour phase epitaxy). If the device is grown using MBE, the techniques described in UK patent application No. 0219728.3 may be employed.

In the growth process, it is preferable if the AlGaN layers 12, 14 are annealed immediately after they have been grown, at a higher temperature that their growth temperatures. If this growth method is used, the buffer layer 2 and lower aluminium-containing layer 12 (in the case of the LED of FIG. 2(a)) or the buffer layer 2, lower cladding layer 3, lower optical guiding region 4 and lower aluminium-containing layer 12 (in the case of the laser of FIG. 2(b)) are initially grown. The deposition of material is then stopped, and the temper in the growth chamber is increased so as to anneal the lower aluminium-containing layer 12 at an annealing temperature that is greater than its growth temperature.

Once the barrier layer 15 has been annealed, the deposition of material is resumed, and the quantum wells layers 13 and the upper aluminium-containing layer 14 are grown to complete the active region 5. The deposition of material is then again stopped, and the temperature in the growth chamber is increased so as to anneal the upper aluminium-containing layer 14 at an annealing temperature that is greater than its growth temperature. The remainder of the LED structure or laser structure is then grown.

This growth process, and its advantages, are described in more detail in co-pending UK patent application No. 0325099.0.

In the embodiments described above the lowermost and uppermost, aluminium-containing layers 12,14 of the active region are AlGaN layers. The invention is not limited to this, and the lowermost and uppermost, aluminium-containing layers 12, 14 of the active region may alternatively be AlGaInN layers.

The invention claimed is:

1. A semiconductor light-emitting device fabricated in a nitride material system and comprising a substrate and an active region disposed over the substrate;
   wherein the active region comprises: a first aluminium-containing layer forming the lowermost layer of the active region; a second aluminium-containing layer forming the uppermost layer of the active region; at least one InGaN quantum well layer; and at least one aluminium-free barrier layer;
   and wherein the at least one InGaN quantum well layer is disposed between the first aluminium-containing layer and the second aluminium-containing layer, and the at least one aluminium-free barrier layer is disposed between the first aluminium-containing layer and the second aluminium-containing layer.

2. A device as claimed in claim 1 wherein the first aluminium-containing layer is a layer of a material selected from the group consisting of AlGaN and AlGaInN.

3. A device as claimed in claim 1 wherein the second aluminium-containing layer is a layer of a material selected from the group consisting of AlGaN and AlGaInN.

4. A device as claimed in claim 1 wherein the active region comprises a first aluminium free barrier layer disposed between the first aluminium-containing layer and the at least one InGaN quantum well layer.

5. A device as claimed in claim 1 wherein the active region comprises a second aluminium-free barrier layer disposed between the at least one InGaN quantum well layer and the second aluminium-containing layer.

6. A device as claimed in claim 1, wherein the active region comprises at least two InGaN quantum well layers, and wherein each two neighbouring InGaN quantum well layers are separated by a respective aluminium-free barrier layer.

7. A device as claimed in claim 1 wherein the or each barrier layer is an InGaN layer.

8. A device as claimed in claim 1 wherein the first aluminium-containing layer is a layer of $Al_xGa_{1-x}N$ where $0<x\leq0.4$.

9. A device as claimed in claim 1 wherein the first aluminium-containing layer has a thickness of no more than 50 nm.

10. A device as claimed in claim 9 wherein the first aluminium-containing layer has a thickness of approximately 20 nm.

11. A device as claimed in claim 1 wherein the second aluminium-containing layer is a layer of $Al_yGa_{1-y}N$ where $0<y\leq0.4$.

12. A device as claimed in claim 1 wherein the second aluminium-containing layer has a thickness of no more than 15 nm.

13. A device as claimed in claim 12 wherein the second aluminium-containing layer has a thickness of approximately 5 nm.

14. A device as claimed in claim 1 wherein the first aluminium-containing layer is not intentionally doped.

15. A device as claimed in claim 1 wherein the second aluminium-containing layer is not intentionally doped.

16. A device as claimed in claim 1 wherein the or each InGaN quantum well layer is an $In_xGa_{1-z}N$ layer where $0<z\leq0.3$.

* * * * *